(12) United States Patent
Brennan et al.

(10) Patent No.: US 7,235,422 B2
(45) Date of Patent: Jun. 26, 2007

(54) DEVICE PACKAGES

(75) Inventors: John M. Brennan, Pittsford, NY (US); Joseph Michael Freund, Fogelsville, PA (US); Jeffrey John Gilbert, Schwenksville, PA (US); John William Osenbach, Kutztown, PA (US); Hugo Fernando Safar, Westfield, NJ (US)

(73) Assignee: Agere Systems Inc., Allentown, PA (US)

( * ) Notice: Subject to any disclaimer, the term of this patent is extended or adjusted under 35 U.S.C. 154(b) by 192 days.

(21) Appl. No.: 11/049,246

(22) Filed: Feb. 2, 2005

(65) Prior Publication Data

US 2006/0172465 A1    Aug. 3, 2006

(51) Int. Cl.
*H01L 21/00* (2006.01)

(52) U.S. Cl. ..................................... 438/106

(58) Field of Classification Search ................ 428/167; 264/300; 257/706; 438/122, 106
See application file for complete search history.

(56) References Cited

U.S. PATENT DOCUMENTS

| 3,002,320 | A  | * | 10/1961 | Theuerer ..................... 264/300 |
| 6,246,115 | B1 | * | 6/2001  | Tang et al. .................. 257/706 |
| 6,399,182 | B1 | * | 6/2002  | Rubel et al. ................. 428/167 |

* cited by examiner

*Primary Examiner*—Carl Whitehead, Jr.
*Assistant Examiner*—Monica D. Harrison

(57) ABSTRACT

Devices such as amplifiers are built on a heat sink having a perimeter wall surrounding active electronic devices. Surprisingly formation of wire bonds to such devices tends to be degraded if they have an aspect ratio greater than 2:1. This problem is overcome by forming wire bonds before such walls have a height of 30 mils and after bond formation extending the walls to their final height.

7 Claims, 4 Drawing Sheets

DEVICE PACKAGES

CROSS REFERENCE

The subject matter of this application is related to that of U.S. patent application 11/049,407 filed Feb. 2, 2005 (Brennan 8-87-11-54-10-6) filed contemporaneously and assigned to a common assignee which is hereby incorporated by reference in its entirety.

TECHNICAL FIELD

This invention relates to integrated circuits and in particular to integrated circuits with high aspect ratio wire bonds.

BACKGROUND OF THE INVENTION

Many integrated circuits, such as RF amplifiers, generate a substantial amount of heat during operation. For example, contemporary RF amplifiers used in wireless communication systems often operate at temperatures approaching 200 degrees C. Clearly at such elevated temperatures, an efficient approach to dissipating the generated heat is required. Thus the packaging for these integrated circuits is generally formed on a heat sink made of a material e.g. copper containing or aluminum containing composition that has excellent heat conducting properties, and the packaging materials are chosen to be resistant to heat degradation.

Many such packages therefore are formed on a metal base or heat sink, 1, in FIG. 1 using materials such as alumina, 5, to form package walls that surround the integrated circuit, 3, forming a cavity package. The package walls provide mechanical and environmental protection to the integrated circuit. For hermetically sealed packages, a lid, typically metal or ceramic, is placed on top of the package after the integrated circuit is die bonded and wire bonded into the cavity region formed by the walls and subsequently sealed with a moisture impermeable material such as a metal or glass. For non-hermetically sealed packages the walls of the cavity package are used to form a dam for subsequent introduction of a polymer, 6, that encapsulates the integrated circuit. (The integrated circuit body is generally referred to as a die.) Electrical connection to the device, e.g. die is formed from metal leads, 7 and the base or heat sink 1. Wires are attached to the capacitor(s), 8, die(s) and leads to make electrical contact. Wire loops with precision shapes are used for proper electrical performance. The die and capacitors are bonded to the base to form thermal and electrical connection to the base. After forming the electrical interconnections the alumina walls, 9, are extended and an alumina cap, 10, is provided.

For many ceramic based packages the material employed for the heat sink is a composite of copper and tungsten. This metallic material is advantageous since it has a coefficient of thermal expansion approximately matching that of the overlying alumina walls. (The coefficient of thermal expansion for copper/tungsten ranges from 6.2 to 6.5 ppm/° C.(room temperature to 500° C.) as compared to approximately 6.9 to 7.2 ppm C.(room temperature to 400° C.) for alumina. Since the copper/tungsten alloy and the alumina have matching coefficients of thermal expansion, differential thermal expansion induced stresses at interfaces between the different materials is small so that the resulting cavity package is relatively stable despite large temperature excursions.

At the same time there has been a continuous drive toward higher and higher electrical power density per device to increase integration and decrease size. Therefore, to maintain a safe operating temperature, the power dissipation the package must provide increases. Accordingly, it becomes desirable to replace the copper/tungsten heat sink with a material that has superior heat conducting properties. One material that is low cost, readily available, easily manufactured in complex shapes, and has a high thermal conductivity is copper. Although copper has a heat conductivity of approximately 391 W/mK, (as compared to approximately 176 W/mK for copper/tungsten), its coefficient of thermal expansion, approximately 17 ppm/C. (room temperature), is a poor match for that of alumina. Thus the use of a copper heat sink despite its improved heat transfer characteristics is precluded for use with alumina walls, unless the copper is embedded into the center of a Cu-W base or some other base material that compensates sufficiently for the coefficient of thermal expansion of alumina. A composite Cu/Cu-W structure is significantly more expensive than a single Cu or Cu-W base. In addition such composite structure is more prone to deformation, and concomitant less than optimum thermal performance when mounted into the system.

To allow use of a copper heat sink, a polymer rather than alumina walls are employed. Polymers such as liquid crystal polymers have a coefficient of thermal expansion matching that of copper and have relatively high melting points compared to other polymers. Such polymers are commercially available from, for example, Ticona Manufacturing-Headquarters, 8040 Dixie Highway, Florence, Ky. 41042 U.S.A., Ticona, GmbH D-65926 Frankfurt am Main. In particular the Vectra line of materials have temperature stability up to 370° C. (Melting temperature (10° C./min); Test Standard: ISO 11357-1,-2,-3.) Although liquid crystal polymers have suitable thermal properties, their coefficient of thermal expansion is anisotropic. That is, their physical properties such as the coefficient of thermal expansion vary with orientation. In general for liquid crystal polymers, the thermal coefficient of expansion in the direction the polymer was drawn during preparation (parallel direction) is generally in the range 3 to 10 ppm/C. ($0.03 \times 10^{-4}$/° C. ISO 11359-2) while the coefficient of thermal expansion in a direction perpendicular to the draw direction (normal direction) is relatively large, 15 to 25 ppm/C. ($0.19 \times 10^{-4}$/°C. ISO 11359-2). Thus if the polymer forming the package walls is all aligned in the appropriate direction, an appropriate match to the thermal expansion properties of copper is possible. Unfortunately, typically at least a portion of the walls in the region adjoining the copper heat sink generally has the lower rather than higher coefficient of thermal expansion in a direction parallel with the major surface of the heat sink due to the requirements of the injection process used to form the walls. Thus although strain due to thermal mismatch between liquid crystal polymer walls and a copper heat sink is substantially reduced relative to a similar structure with alumina walls, thermal mismatch issues still remain.

Even once materials for the package are chosen, the assembly of the package using those materials is not free from difficulties. The height and shape of the lead wires, 4, in FIG. 1 are critical to tuning the RF response of the device. As the frequency of such devices increases, so does the height of these wire loops. Thus the height of walls, 5, must be extended so that the polymer, 6, introduced after the lead wires are connected, encapsulates such wires and prevents damage or a change in geometry.

FIG. 2 illustrates a wirebond tool head including wire clamps. The bonding tool is normally held vertically but wire clamps behind the tool are at an angle generally between 30 and 60 degrees. A tool shown at 22 in FIG. 2 is introduced, for example, to bond the wire, 21, to the capacitor block. Such bonding is accomplished by introducing ultrasonic energy through the tool together with compression also induced by the tool. As shown in FIG. 2, the height of the walls limits the angle at which it is possible to introduce the tool, 22. The geometry at the edge, 23, of the tool is chosen to accommodate this angle limitation. Generally an angle between 30 and 60 degrees has been employed. After the walls are positioned the wire bonds are formed and the remaining package is assembled.

Thus new packages employing copper heat sinks and polymer side walls have been introduced and solve many issues associated with high performance devices. However, improvement, as discussed, is certainly possible.

SUMMARY OF THE INVENTION

Surprisingly it has been found that the assembly process has been substantially compromised for devices including wire electrical interconnection loops with geometries having 1) a loop height to wire length aspect ratio greater than 2:1 for 2) a loop height greater than 10 mils. (Such geometry satisfying these two criteria are denominated high aspect ratio geometries in the context of this invention. The wire length is the distance along the wire between bonding points forming the electrical connection between the die and another component. The loop height is the distance measured normal to the major surface of the heat sink to the point on the wire furthest above this surface.) The angle limitations induced by the sidewalls compel a compromise in compression tool geometry that leads to unreliable bonds of the wire with the die, capacitor, and/or lead frame. Thus an expedient is required to avoid such problems in devices having this high aspect ratio geometry. In one embodiment to avoid this unexpected degradation, the sidewalls are either formed after wire bonding or the sidewalls are formed to a limited height that allows successful bonding and then extended to a height necessary for introduction of the encapsulating polymer and/or a lid that clears the wire loops. Thus, undesirable interaction between the tool and the package geometry is avoided and the required wire bond configuration is maintained while forming a satisfactory bond.

DETAILED DESCRIPTION

Surprising results have been found for devices with 1) at least one lead wire having loop height to wire length aspect ratio greater than 2:1, especially greater than 5:1, and 2) a loop height greater than 10 mils, (i.e. a high aspect geometry in the context of this invention). In particular, the connection between such wire and the lead frame or other point of attachment such as capacitors external to the die are not expeditiously made and tend to suffer inadequate bonding. A number of techniques are possible for avoiding the difficulties induced in the wire bonding process. Generally, wire bonds for wires having high aspect ratio geometries should be made before forming on the heat sink walls with a height greater than the loop height used in the final device configuration. Generally, the maximum loop height varies from 10 mil to 60 mil. (The height of a wall is measured in a direction normal from the major surface of the heat sink it adjoins and the height is given by the median height so measured along the perimeter of the wall.)

Figure 1:
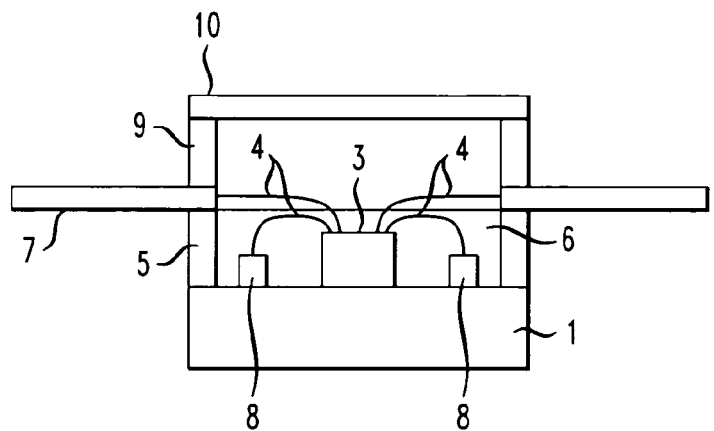
FIGS. 1 through 3 illustrate construction of device packages.
Figure 2:
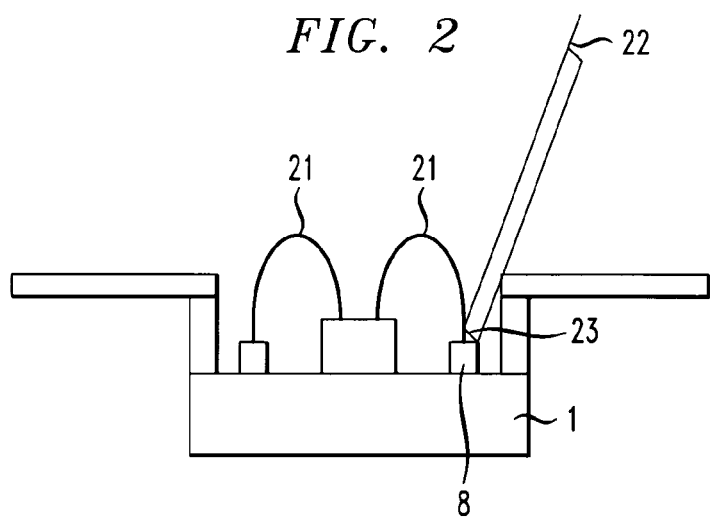
Figure 3:
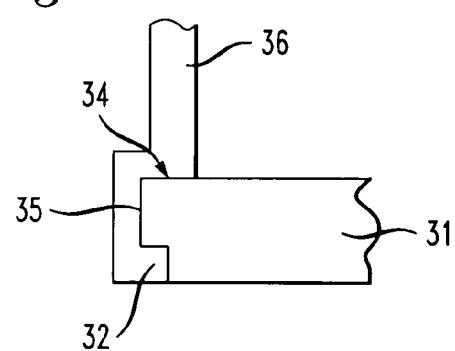
Figure 4:
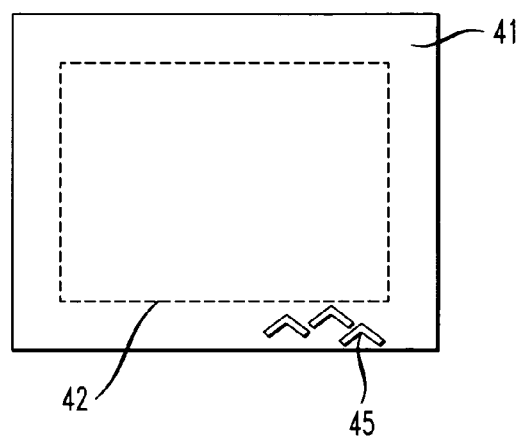
FIGS. 4 and 5 are exemplary of structures involved in interaction between heat sink and walls.
Figure 5:
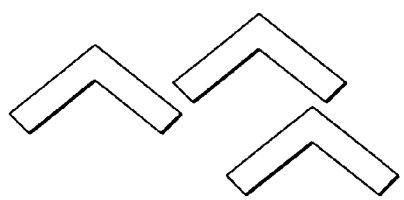
Figure 6:
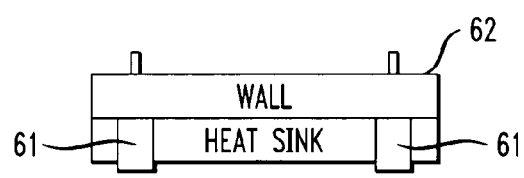
FIGS. 6 through 12 illustrate a process for forming a device package.
Figure 7:
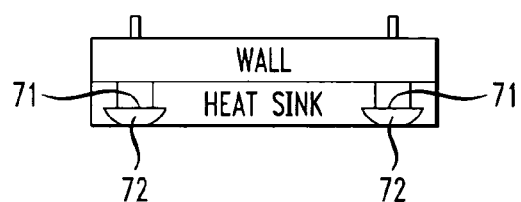
Figure 8:
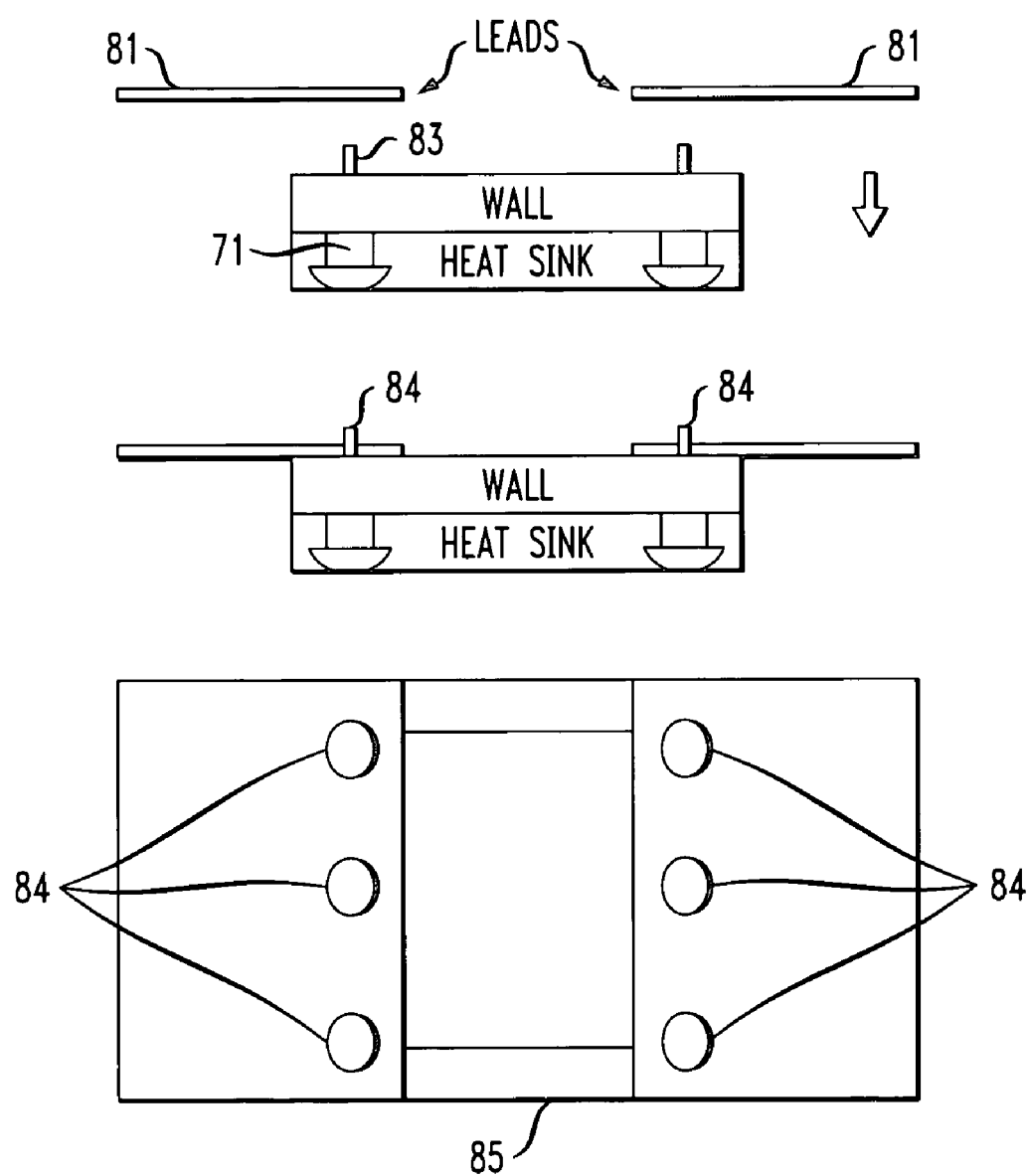

The heat sink is generally formed of a metal such as copper or aluminum with a surface area in the range 25 mm$^2$ to 2500 mm$^2$ and a thickness in the range 5 mil to 100 mil. Although greater thicknesses and surface areas are not precluded, typically, those indicated are sufficient for dies having dimensions in the range 10 mm$^2$ to 2000 mm$^2$. Generally a portion of the wall is formed around the perimeter of the heat sink for support of metal external leads. Typical materials for these walls are liquid crystal polymers (LCP). As discussed above, the height of this initial wall portion should be sufficiently small to allow a bonding tool having the desired tip angle to be used without interference. For high aspect ratio wires, wall heights less than 30 mils are generally employed before wire bonding. (Generally it is desirable to form the external leads on this insulating wall portion, but formation of the leads without completion of the wall perimeter is not precluded.) The wall is generally attached to the heat sink using stakes as shown in FIG. 6 at 61. These stakes are typically formed of LCP and attachment at 71 as shown in FIG. 7 is generally accomplished by ultrasonic staking. In this bonding process ultrasonic energy in the range 45 mA to 65 mA is typically applied at 72 with a compressive force in the range 40 grams to 55 grams over an area in the range 1 mil to 7 mils. The external leads to which wires are attached for electrical connection to the die and/or a capacitor and/or other element of the package are introduced such as shown in FIG. 8 at 81. In one advantageous method the leads 81 have openings that are fitted around the end 83 of stakes 71 leading to the configuration shown in plan view 85. The leads are attached, for example, again using ultrasonic bonding in the previously described energy range applying compressive forces at 84 as discussed above. Alternatively, the walls are formed by a molding process such as described in co-pending, coassigned application 11/049,407 filed Feb. 02, 2005 (Brennan 8-87-11-54-10-6), as shown for example, in FIGS. 4 and 5, and the lead frame is attached by injection molding to walls having a height generally less than 30 mils.

Figure 9:
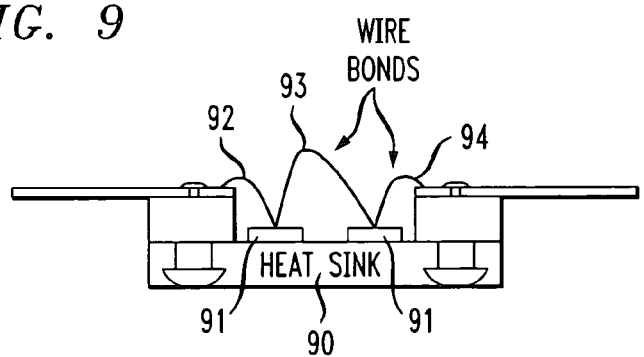

A die or dies are attached to the heat sink or to a structure communicating (e.g. thermally communicating) with such heat sink generally by employing methods such as eutectic die attachment with alloys such as AuSi or AuSn. Additionally, if desired, capacitors or other components such as discrete components are also attached to the heat sink or to a body overlying the heat sink by processes such as eutectic die attachment. Thus, as shown in FIG. 9, dies 91 are attached to heat sink 90. Electrical interconnections are made between and/or among the dies, the lead frame, and the capacitors or other components if present. Some of such possible wire interconnects are illustrated in FIG. 9 at 92, 93, and 94. As discussed, by employing walls of height less than 30 mils before making high aspect ratio wire interconnects, wires are accommodated without degradation of the desired electrical interconnection.

Figure 10:
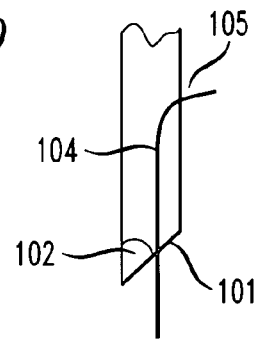

Bonding of the wires at the lead frame, die, capacitor, or at other components present in the structure are formed typically using a tool denominated a wedge bond tool. It is preferred that bonding first be performed at the die and then at the external lead to facilitate as short a wire bond as possible from, for example, the die drain to the external lead. This tool has an angular end determined by the wire clamp mechanism where the bonding feed angle, angle 102, as shown in the cross section of FIG. 10 at 101, is typically in the range 38 to 45 degrees. Angles greater than 45 degrees lead to reduced loop profile process control while angles less than 38 degrees are unacceptable because the tool will interfere with package features. The wire 104 for forming the interconnect is introduced in the tool as shown at 102 and is bonded at the desired location by thermosonic compression bonding. A tool having an implementation angle in the range 38 to 45 degrees is employable with a resulting acceptable balance of resulting properties when the walls have a height less than 30 mils at the time of bonding. The process produces electrically viable, stable wire bonds.

Figure 11:
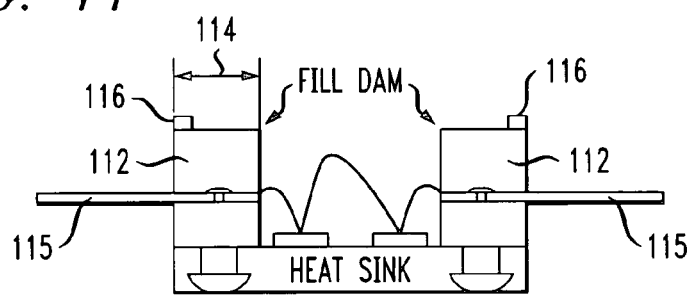
Figure 12:
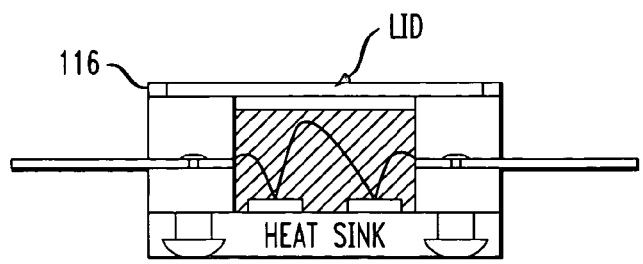

The wall height is then increased such as shown in FIG. 11 so that such walls act as a suitable dam for introducing a polymer that encapsulates the previously formed wire bonds and/or supports a lid above the wire loops. These walls 112 are typically formed of polymer material, have a width 114 in the range 10 to 40 mils, and are attached to the leads 115 by ultrasonic welding. In one suitable configuration, a cavity for subsequent introduction of a lid is formed by employing member 116 around the perimeter of the walls. Typically this structure has a height in the range 15 mils to 65 mils and a width in the range 5 mils to 30 mils. Cavity fill material is then introduced to isolate the wires and dies as well as other components from contamination. Such fill materials are generally of the composition epoxy, acrylics or silicones and are introduced by liquid injection. A lid as shown in FIG. 12 is then advantageously used to seal the package. This lid is introduced in the previously formed cavity structured by members 116 and is attached either by a mechanical snap-in feature, by ultrasonic welding, or by a suitable adhesive.

We claim:

1. A process for making an electronic device package, said process comprising forming walls around the perimeter of and on the major surface of a heat sink, said walls having a height less than 30 mils, introducing at least one component including a die in communication with said major surface, making an electrical connection between said die and another element of said package, said connection made by wire bonding a wire to said die and to said element using a bonding tool wherein said wire making said connection has an aspect ratio between the loop height of said wire and the length of said wire greater than 2:1 and a height greater than 10 mils and, after said bonding to said die extending said walls beyond a height of 30 mils.

2. The process of claim 1 wherein said element comprises a lead.

3. The process of claim 1 wherein said element comprises a capacitor.

4. The process of claim 1 wherein said heat sink comprises copper, or aluminum.

5. The process of claim 1 wherein said tool has a bonding angle in the range 38 to 45 degrees.

6. The process of claim 1 wherein said wire is encapsulated after said wall is extended.

7. The process of claim 1 wherein said aspect ratio is greater than 5:1.

* * * * *